(12) United States Patent
Wu

(10) Patent No.: US 7,804,711 B2
(45) Date of Patent: Sep. 28, 2010

(54) METHODS OF OPERATING TWO-BIT NON-VOLATILE FLASH MEMORY CELLS

(75) Inventor: Chao-I Wu, Zhubei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 122 days.

(21) Appl. No.: 12/035,786

(22) Filed: Feb. 22, 2008

(65) Prior Publication Data

US 2009/0213651 A1 Aug. 27, 2009

(51) Int. Cl.
*G11C 16/04* (2006.01)
(52) U.S. Cl. ............ 365/185.03; 365/17; 365/185.27
(58) Field of Classification Search ............ 365/185.03, 365/185.17, 185.29
See application file for complete search history.

(56) References Cited

U.S. PATENT DOCUMENTS

2005/0030828 A1* 2/2005 Tanaka .................. 365/232
2005/0276105 A1* 12/2005 Yeh et al. ............ 365/185.17

* cited by examiner

*Primary Examiner*—Hoai V Ho
(74) *Attorney, Agent, or Firm*—Jianq Chyun IP Office

(57) ABSTRACT

A method for erasing a plurality of two-bit memory cells, each two-bit memory cell comprises a first bit and a second bit. A reference voltage is applied to a first bit line and a second bit line, the first bit line being associated with the first bits of each two-bit memory cell and the second bit line associated with the second bits of each two-bit memory cell. Then a control activation voltage is applied to a first bit line select and a second bit line select, each bit line associated with the first bits and the second bits of each memory cell, respectively. Then an operating voltage is applied to a plurality of word lines associated with each two-bit memory cell, wherein the operating voltage is between 14 and 20 volts.

2 Claims, 11 Drawing Sheets

CHE Program at Bit-R
to high-Vt

CHE Program at Bit-L
to high-Vt

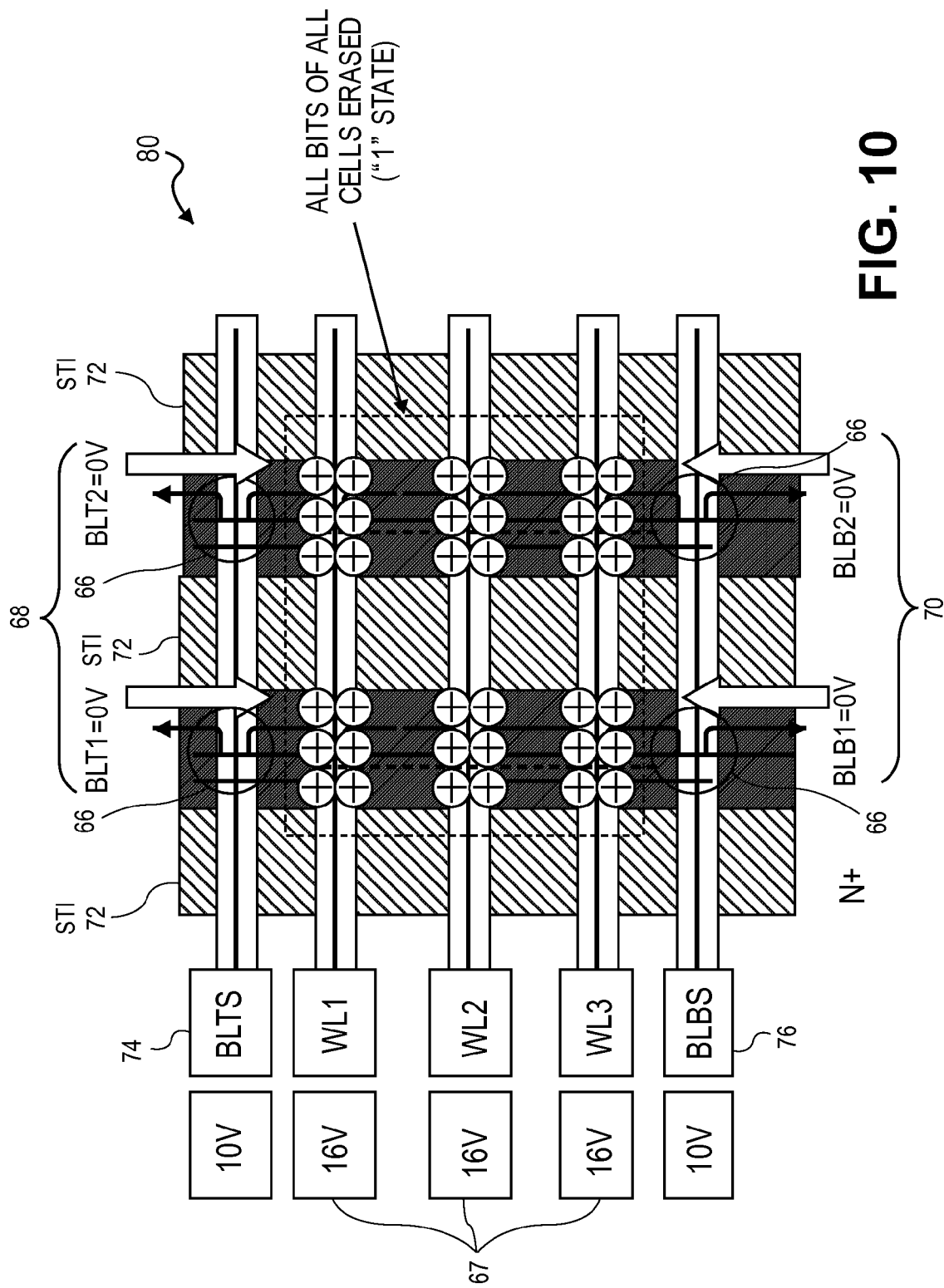

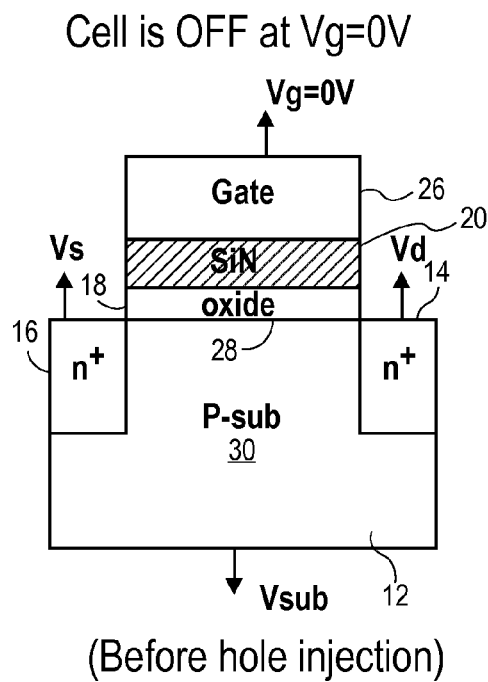
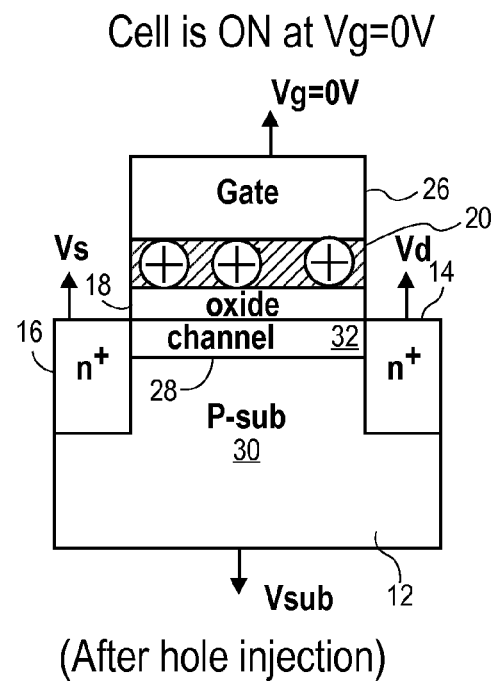
FIG. 11A
FIG. 11B

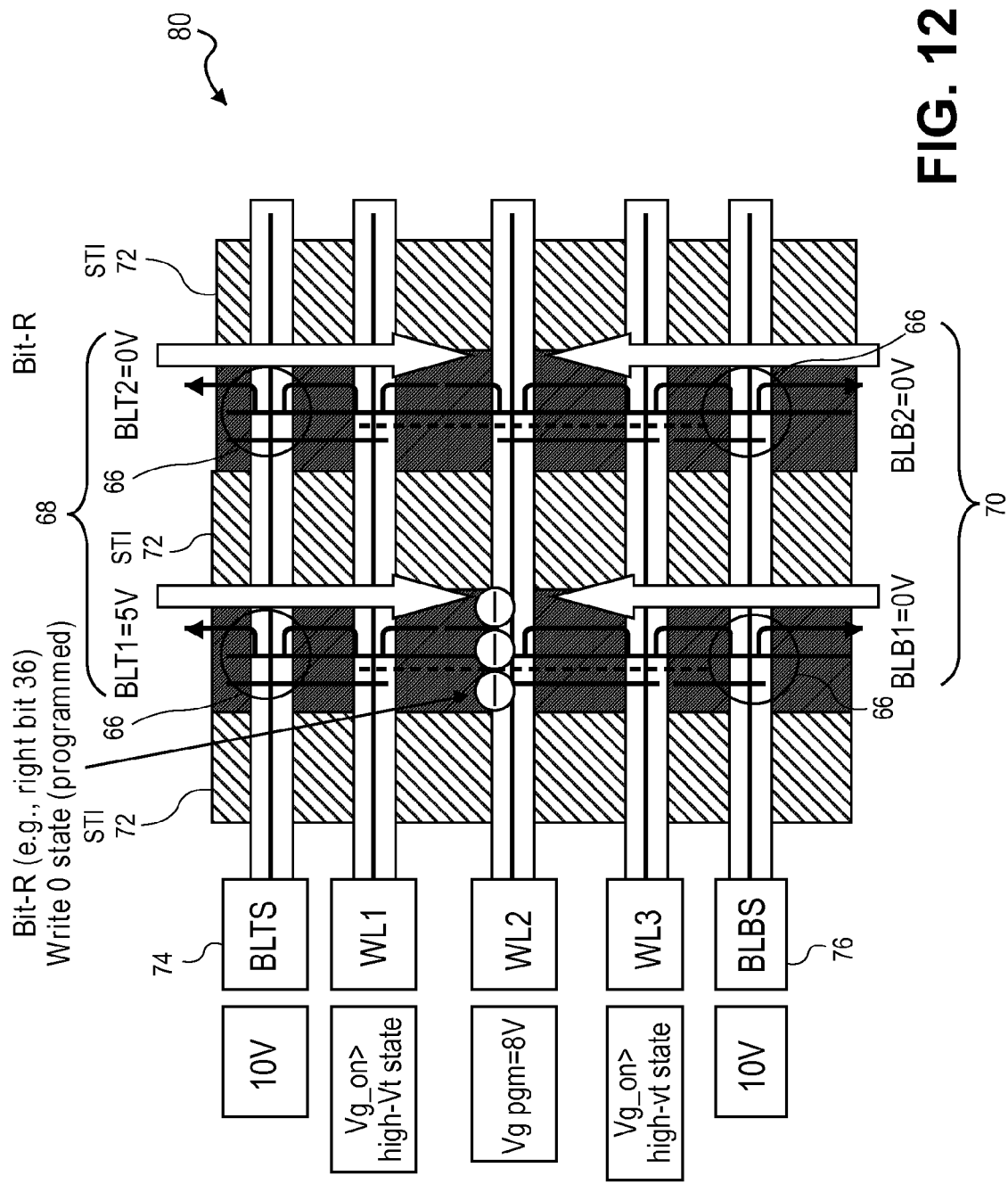

METHODS OF OPERATING TWO-BIT NON-VOLATILE FLASH MEMORY CELLS

FIELD

This application relates to non-volatile flash memory ("NVM") semiconductor devices and more particularly, to NVM semiconductor devices having two-bits per cell using a not-and-gate (NAND) array and methods of programming the semiconductor device.

BACKGROUND

The present invention relates to non-volatile flash memory ("NVM") semiconductor devices, which can continually store information even in the absence of electricity supply. More particularly, the invention relates to NVM semiconductor devices having two-bits per cell employed in a not-and-gate (NAND) array.

Multi-level, or multi-bit, flash memory cells provide a solution for increasing the amount of data that can be stored on a memory device without consuming more space. Whereas a single-bit cell can store only two states, "on" and "off" (typically labeled "0" and "1"), a cell having n bits and using binary encoding is capable of storing up $2^n$ states. Thus, a two-bit cell may store data in four discrete states, "00", "01", "10" and "11" which is distinctly more efficient that the "0" or "1" state alone.

Conventional two-bits per cell NVM semiconductor devices have a narrow "window of operation" after programming. This operational window is generally described as the difference in the threshold voltage (Vt) of a programmed cell bit as compared to the Vt of the un-programmed (erased) state. In a two-bit memory cell the operational window is also known as the second bit window of operation. The second bit window of operation is generally described as the second-bit effect on the Vt of one bit not undergoing a programming action by the programming of the other bit associated with the same cell (the target bit). For example, as a left bit is programmed from its initial state with Vti to its programmed state with a programmed Vt, the Vt of the right bit, which is not being programmed, undergoes an undesired "shift." Meaning the right bit Vt (voltage) is adjusted higher for the same bit state that existed before the left bit was programmed. The result is a narrow operational window for that bit.

BRIEF SUMMARY

A method and system for erasing a plurality of two-bit memory cells, wherein each two-bit memory cell comprises a first bit and a second bit, includes applying a reference voltage to a first bit line and a second bit line, the first bit line being associated with the first bits of each two-bit memory cell and the second bit line associated with the second bits of each two-bit memory cell. Then applying a control activation voltage to a first bit line select and a second bit line select, the first bit line select associated with the first bits of each memory cell and the second bit line select associated with the second bits of each memory cell. Next, the method and system includes applying an operating voltage to a plurality of word lines associated with each two-bit memory cell, wherein the operating voltage is between approximately 14 and 20 volts.

A memory array includes a semiconductor substrate and a plurality of two-bit memory cells having a first and a second source/drain regions set in the semiconductor substrate, each memory cell including a dielectric trapping layer for storing charge and the dielectric trapping layer disposed between a first oxide layer over the semiconductor substrate and a gate layer over the first oxide layer. The memory array also includes a plurality of word lines coupled to the gate layer and a gate voltage source coupled to the plurality of word lines and configured to apply operating voltages between approximately 14 and 20 volts to the plurality of word lines. A plurality of bit lines are disposed substantially perpendicular to the plurality of word lines, the plurality of bit lines are in electrical communication with the first and the second source/drain regions of the plurality of two-bit memory cells. A plurality of bit line control cells are disposed at the beginning and end of each bit line of the plurality of bit lines, the bit line control cells are configured to control the electrical communication of each bit line with the first and the second source/drain regions of the plurality of two-bit memory cells.

BRIEF DESCRIPTION OF THE SEVERAL VIEWS OF THE DRAWINGS

The embodiments illustrated in the figures of the accompanying drawings herein are by way of example and not by way of limitation. In the drawings:

FIG. 10 illustrates a method of operations pertaining to erasing a multitude of NVM cells in the NAND array;

FIGS. 11A and 11B illustrate various exemplary advantages of the hole injection erase operation at the memory cell level;

FIG. 12 illustrates the second operation of the TOM for programming a nonvolatile memory cell in the NAND array;

DETAILED DESCRIPTION

Figure 2B:
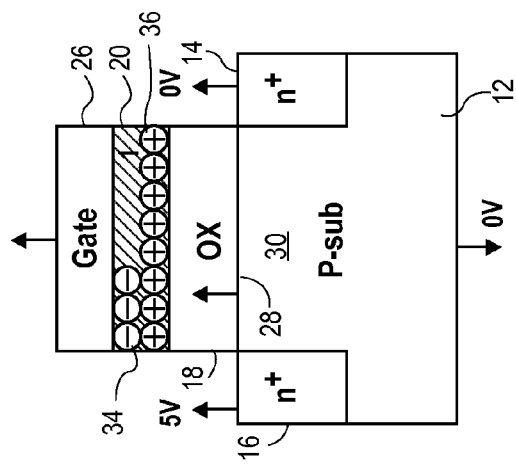
FIG. 2B illustrates an NVM cell, according to one embodiment of the invention, similar to that of the NVM cell of FIG. 1, including a left bit and a right bit.

Embodiments of the present invention relate to non-volatile memory ("NVM") semiconductor devices that implement multiple bit programming, specifically two-bits per cell, and the application of the two-bit NVM cell to a not-and-gate (NAND) array. Further, embodiments of the invention include various methods and structures that may reduce the second bit effect on the two-bit NVM cell to increase the window of operation of the two-bit cell.

The method of the present invention, dubbed the "Turn-On-Mode" method, increases the second bit window of operation of the two-bit cell NVM by lowering the initial voltage threshold (Vti) of both the left and right bits so that the effect of programming one of the left or right bits (the target bit) on the Vt of the non-target bit is lower than if the Vti of both bits was at a higher level. The present invention also discloses the structure of a NAND array with two-bit NVM cells and divided bit lines necessary to implement the "Turn-On-Mode" method referred to above.

The conventional NAND array is modified for two-bit cell implementation of the Turn-On-Mode method by, in addition to replacing the one-bit NVM cells with two-bit NVM cells, dividing the bit lines of the array so that positive voltage can be applied from both the top bit lines (bit line connections in the top region of the array, called Bit Line Top) as well as the bottom bit lines (bit line connections in the bottom of the array, called Bit Line Bottom). In a conventional NAND array, only ground potential is referenced at the bottom bit line connections (Bit Line Bottom).

The first operation of the Turn-On-Mode method is to erase all the two-bit NVM cells in the array via a hole injection erase in which reference voltage is applied to the source/drain regions and the substrate of the memory cells while a positive bias voltage is applied to the NVM cell gate. Holes may then be injected into the trapping layer of the semiconductor to induce a channel in the substrate between the two source/drain regions. The trapped hole charge will also lower the Vt of the cell for both the left and right bits. This may provide an advantage of turning on the memory cell with a negligible voltage or low reference voltage applied to the gate.

The second operation of the Turn-On-Mode method is to program the right and then the left bits, or vice versa. Conventional programming methods, such as Channel Hot Electron (CHE), programming may be used for this operation of the Turn-On-Mode method. Programming voltages are applied to the target source/drain region or regions via the Bit Line Top and/or the Bit Line Bottom. In general, a programming voltage close to that of a reference voltage can be considered to be a programming voltage in that the bit associated with the source/drain to which it is applied is being written to a logic 1 state. However, as a logic 1 state is generally considered to be an un-programmed state, for purposes of this disclosure, programming will be considered to be the operation of writing a bit to a logic 0 state.

Returning to the second operation, a programming voltage may also be applied to the gate or gates of the target cells via the word line associated with the target cell(s). Intermediate world lines may also have a bias voltage applied as necessary to merely activate the intermediate memory cells so that the Bit Line Top and Bit Line Bottom can convey the programming voltage to the target source/drain region(s) of the target memory cells. The erase operation of the Turn-On-Mode method provides for improved CHE efficiency in that without the disclosed erase operation, program current for CHE programming would be greater than 100 µA. In contrast, CHE erase operations associated with present embodiments of the invention may require less than 20 µA.

The last operation in the Turn-On-Mode method is the read operation wherein the state of the right and left bits of the target memory cell(s) are read to ascertain their state as either programmed or un-programmed. In one embodiment, in the cell or cells to be read, read voltages are applied to the source/drain region opposite that source/drain region associated with the bit to be read. In other words, to read the left bit of a cell or cells, a read voltage is applied to the source/drain associated with right bit of the cell. These read voltages are applied via the Bit Line Top and the Bit Line Bottom to the right and left bit source/drain respectively. The gates of the cells to be read have a read voltage applied via the associated word line. The read voltage is a magnitude between the cell's erased Vt and the cell programmed Vt. Intermediate word lines are biased to the extent that the cells associated with the word line are activated to conduct voltage transmitted via the Bit Line Top and Bit Line Bottom.

As used herein, reference to conductivity will be limited to the embodiment described. However, those skilled in the art know that p-type conductivity may be switched with n-type conductivity and the device would still be functionally correct (i.e., a first or second conductivity type).

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to lightly doped n and p regions, respectively. However, such relative doping terms should not be construed as limiting. Additionally, all voltages provided to structures discussed herein may be provided from one or more internal or external voltage sources, or any combination thereof.

For simplicity, with reference to the figures like reference numerals are used throughout to indicate like elements whenever possible.

Figure 1:
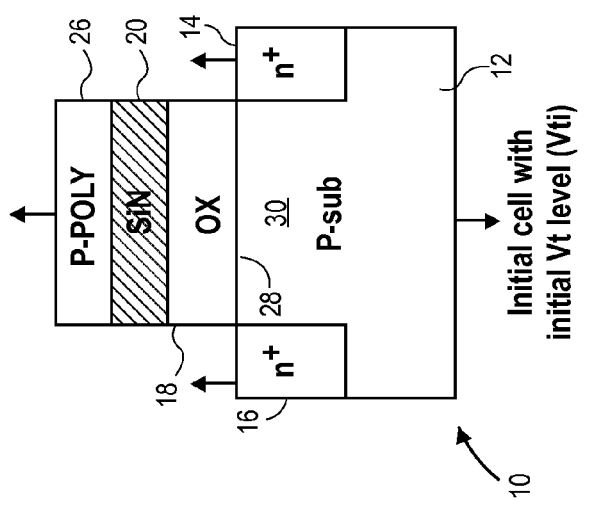
FIG. 1 is a partial sectional side elevation view of a non-volatile memory (NVM) cell, according to one embodiment of the invention.

FIG. 1 is a partial sectional side elevational view of a non-volatile memory (NVM) cell 10, according to one embodiment of the invention. The NVM cell 10 may include a substrate 12, a first source/drain layer 14, a second source/drain layer 16, an oxide layer 18, a nitride charge trapping layer 20 (e.g., a dielectric trapping layer), a gate layer 26, a substrate surface 28, and a well region 30 within the substrate 12.

In various embodiments, the gate layer 26 may be composed of the p-polysilicon doped material as shown, n-doped polysilicon material, or metal. The NVM cell 10 may have a threshold voltage (Vt) applied to the gate (not shown) of gate layer 26 to facilitate the conduction of current from a first source/drain region to the second source/drain region. In a default un-programmed state each bit (right and left) is in a "1" state. Certain conditions may cause the Vt of the NVM cell 10 to increase. For example, programming one of the bits from a "1" to a "0" (e.g., Bit-L programmed "0" and Bit-R un-programmed "1") may cause the Vt of the NVM cell 10 to increase. As previously mentioned, this may result in a narrow operational window.

In contrast, a large operational window, or greater difference in the un-programmed Vt from the programmed Vt, may have several advantages, such as permitting a clearer distinction between the programmed and un-programmed cell states for one-bit cells and allowing for a clearer discrimination among the four distinct programmed cell states, "00", "01", "10" and "11," referred to above. Additionally, memory cells having a large operational window may also have the advantage of tolerating more charge loss, read-disturb, and have greater program-erase endurance than those memory cells with a narrow operational window caused by second-bit effect.

Figure 2A:
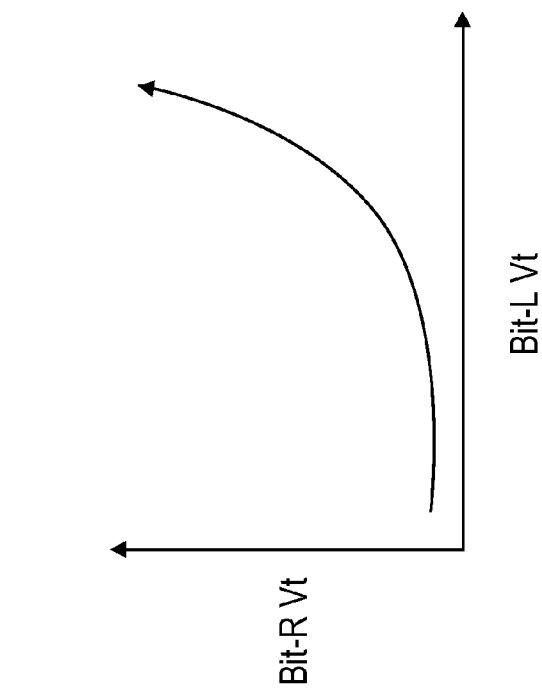
FIG. 2A is a graphical illustration of the second-bit effect.

FIG. 2A is a graphical illustration of the second-bit effect. The effect may be seen on the right bit (Bit-R) voltage threshold (Vt) through various left bit (Bit-L) voltages during programming using a method such as channel hot electron injection (CHE). As the left bit voltage (Vt) increases to the right, the value of the Vt of the right bit (e.g., left bit 34 and right bit 36, see FIG. 2B) increases. Thus, the higher the second-bit effect on the Vt of the un-programmed right bit, the narrower the operational window.

Figure 2C:
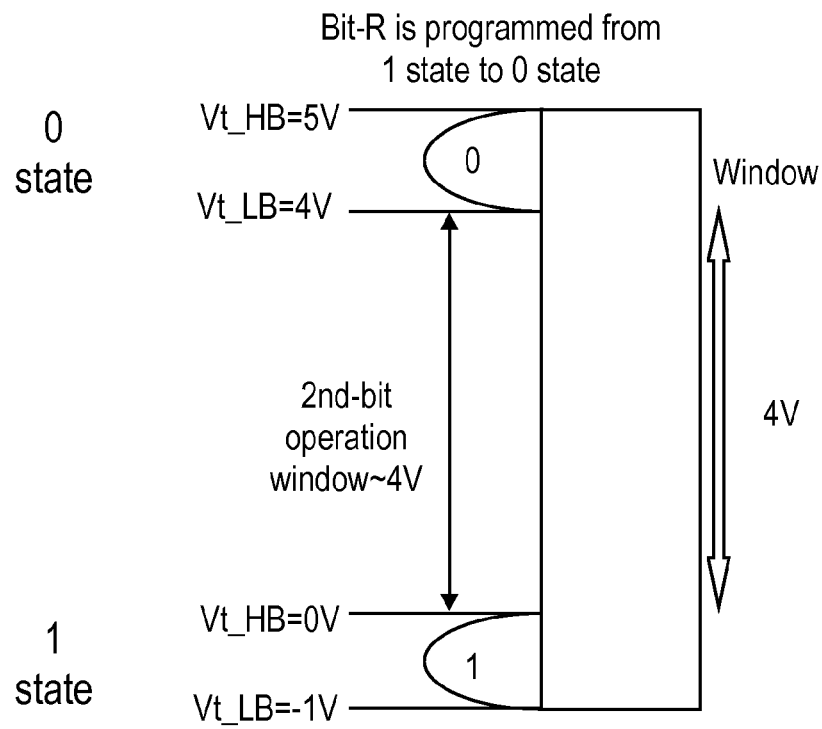
FIG. 2C illustrates a Vt voltage diagram when, according to one embodiment, the right bit is programmed from a "1" to a "0" state.

FIG. 2B illustrates an NVM cell, according to one embodiment of the invention, similar to that of the NVM cell 10 of FIG. 1, including a left bit 34 and a right bit 36. As illustrated, the left bit 34 is in a "0" state (or programmed state) while the right bit 36 is in a "1" state (or erase/un-programmed state). FIG. 2C illustrates a Vt voltage diagram when, according to one embodiment, the right bit 36 is programmed from a "1" to a "0" state. As previously discussed, the operational window is defined by the Vt difference between the program state and the erase state for a given bit. In this example, the operational window is 4V (Vt_HB)–0V (Vt_LB), which equals 4V. In one embodiment, as discussed in further detail below, a large operational window may be created by programming from a lower initial voltage threshold Vti (Vt_HB), thus creating a larger variance between the un-programmed state and the programmed state.

In various embodiments, a lower initial threshold voltage (Vti) to program from may be facilitated by using a Turn-On-Mode (TOM) program, erase, and read operations on the NAND array. By erasing the cell Vt to a lower level, the second-bit effect (e.g., on right bit 36) may be minimized upon subsequent programming of the first bit (e.g., left bit 34), and thus a larger operational window created when the second bit (e.g., right bit 36) is finally programmed, as described above.

Figure 3:
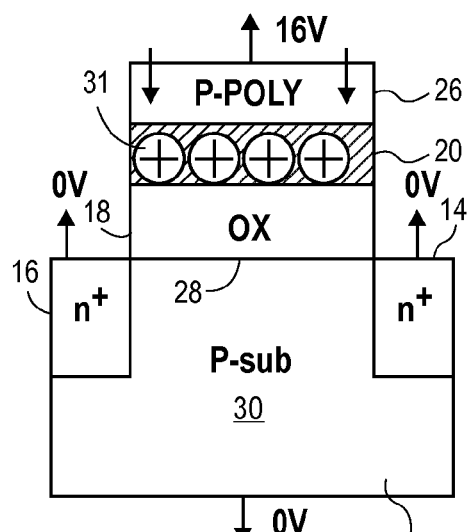
FIG. 3 is a partial sectional side elevation view of an example embodiment of the NVM cell of FIG. 1A illustrating a hole injection erasure of the NVM cell.

FIG. 3 is a partial sectional side elevation view of an example embodiment of the NVM cell 10 of FIG. 1A illustrating a hole injection erasure of the NVM cell 10. In one embodiment, holes 31 may be induced to flow from the gate layer 26 into the nitride layer 20 by application of a gate voltage bias of approximately 14-20 volts direct current (DC), and a reference voltage (e.g., 0 volt) to the first and second source/drain regions, 14 and 16 respectively, and to the substrate region 12. Hole injection erasure, when applied to the NVM cell 10 at this gate voltage level, may lower the cell's initial Vt to a level that may reduce second-bit effect during subsequent programming. In various embodiments the reduced level of the Vt may be near zero or negative. As discussed above, the lower the initial voltage (Vti) the less the second-bit effect and the larger the operational window for each bit of the cell.

Figure 4B:
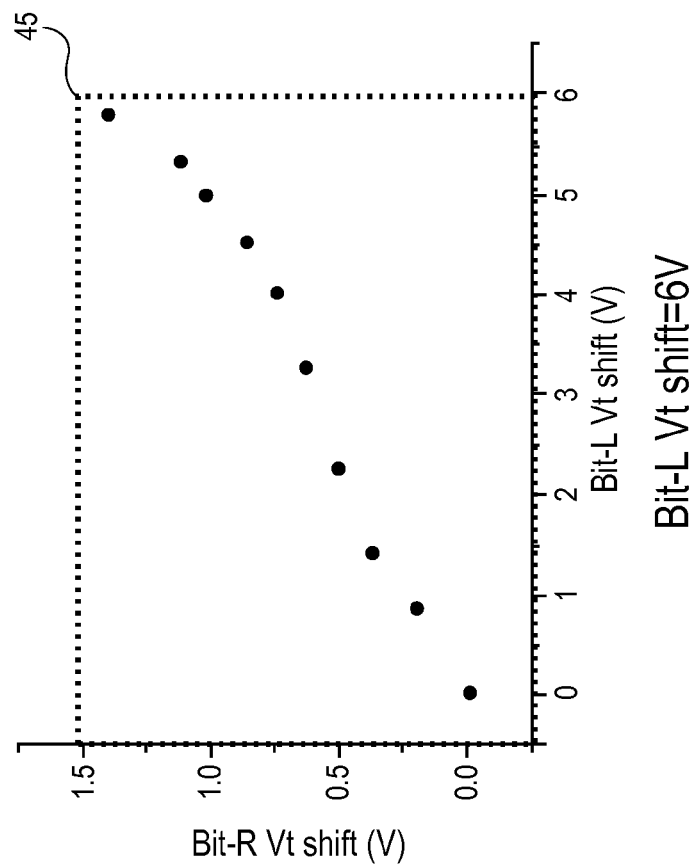
FIG. 4B illustrates the programming and shift of the left and right bits respectively, in absolute voltage.
Figure 4A:
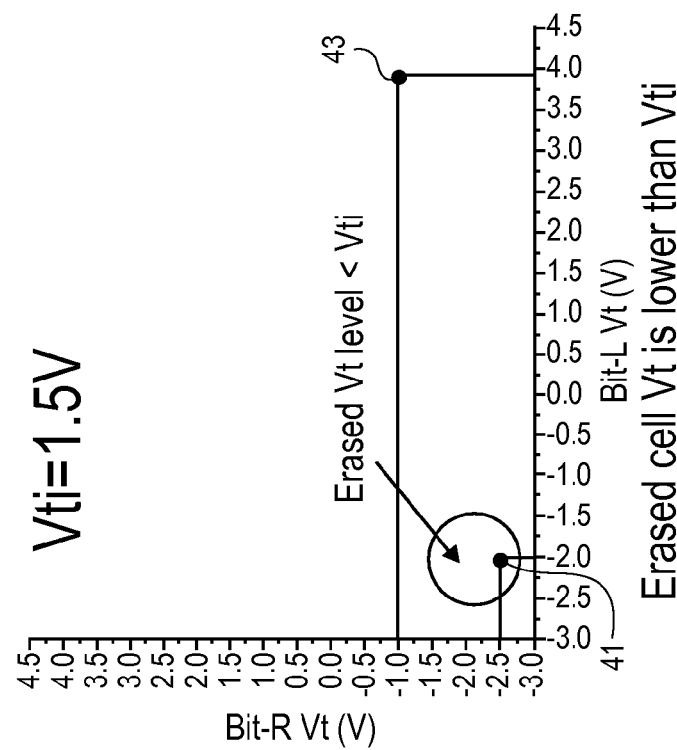
FIG. 4A is graph illustrating the lessoned effects of the second-bit shift of the Bit-R when the Vt level of the cell (right bit and left bit) is erased, according to one embodiment of the invention, to a level less than the Vti.

FIG. 4A is graph illustrating the lessoned effects of the second-bit shift of the Bit-R (e.g., right bit 36) when the Vt level of the cell (right bit and left bit) is erased, according to one embodiment of the invention, to a level less than the Vti. The initial erased Vt level is shown at data point 41, the Bit-L (left bit) had an initial voltage of –2.0V and the Bit-R (right bit) had an initial voltage of –2.5V. After the left bit has been programmed, as shown at data point 43, the left bit is at +4.0V and the right bit has shifted to –1.0V. FIG. 4B illustrates the programming and shift of the left and right bits respectively, in absolute voltage. As shown at data point 45, the left bit has shifted from –2.0 to 4.0 volts for a shift of 6 volts, while the un-programmed right bit has only shifted from –2.5 to –1.0 for a shift of 1.5 volts. In other words, the lower the initial Vt (Vti) of both the bit to be programmed (the target bit) and the non-programmed bit, as erased according to one embodiment of the invention, then the lower the induced Vt shift for the non-programmed bit as the programmed bit undergoes a larger Vt shift during programming. In this example, the difference in the Vt shifts of both bits is a 4.5 volt second bit operational window. In various embodiments, the programming (i.e., charge injection) in two-bit NVM cells is achieved by various conventional hot carrier injection methods such as channel hot electron injection (CHE), source side injection (SSI) or channel initiated secondary electron (CHISEL).

The result of the hole injection erasure on the Vt of the NVM cell 10 may be seen graphically in FIG. 4A. As FIG. 4A illustrates, the erased Vt of the memory cell will be lower than the initial Vt of the cell (Vti). As seen in FIG. 4B, with a lower Vt, the second bit effect of the programming of the Bit-L 34 on the Vt of Bit-R (the non-target bit) will be nominal. In the example of FIG. 4B, a 6 volt programming shift in the Vt of Bit-L 34 (from –2 volts to 4 volts) results in only a 1.5V non-programming shift in the Vt of Bit-R 36 (from –2.5 volts to –1.0 volts).

Figure 5:
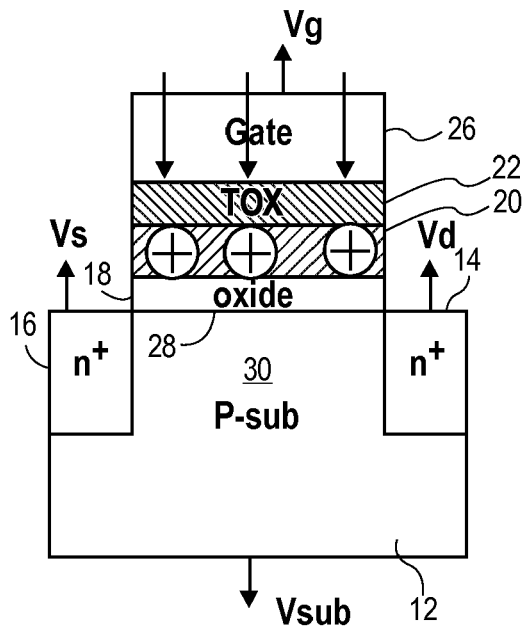
FIG. 5 is an example embodiment of the invention including structure for erasing an NVM cell.

FIG. 5 is an example embodiment of the invention including structure for erasing an NVM cell, similar to the NVM cell 10. The NVM cell includes an additional oxide layer 22 (top oxide (TOX) layer) located beneath the gate layer 26 and above the nitride trapping layer 20 (e.g., a dielectric trapping layer). The additional oxide layer 22 may be optimized to a thickness that facilitates hole charge tunneling. In various embodiments, the oxide layer 22 may have, but not be limited to, a thickness of less than or equal to 30 Angstroms. An NVM cell including the oxide layer 22 along with the application of a gate bias voltage of approximately 14-20 volts direct current, a reference voltage applied to the first and second source/drain regions 14 and 16, and the substrate region 12, may result in an erasure similar to that of the NVM cell 10 (e.g., Vt<Vti), as discussed with reference to FIG. 3.

Figure 6:
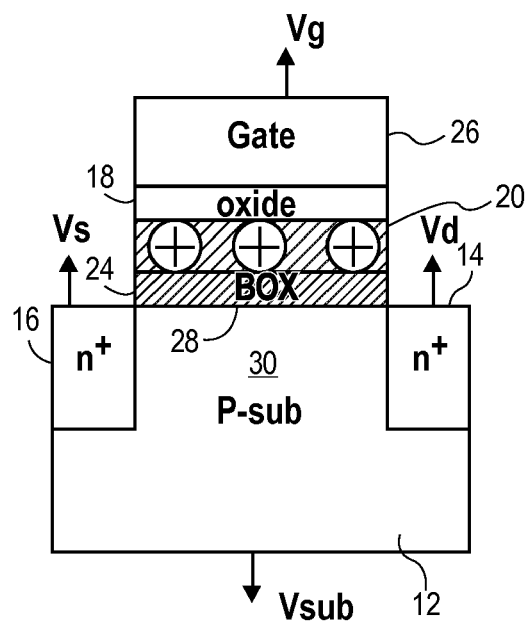
FIG. 6 is an example embodiment of the invention including structure for erasing an NVM cell.

FIG. 6 is an example embodiment of the invention including structure for erasing an NVM cell, similar to the NVM cell 10. The NVM cell includes an additional oxide layer 24 (bottom oxide (BOX) layer) located beneath the nitride trapping layer 20 and above the substrate region 12. The first oxide layer 18 is located beneath the gate 26 and above the nitride trapping region 20 in this configuration. This additional oxide layer 24 is optimized such that, in various embodiments of the invention, the application of a gate bias voltage of approximately –14 to –20 volts direct current and the application of a reference voltage to the first and second source/drain regions 16 and 18, and the substrate region 12 will result in an erasure similar to that of the NVM cell 10 (e.g., Vt<Vti), as discussed with reference to FIG. 3. In this example, in apposite to FIG. 5, holes are conducted from the substrate region 12 through the bottom oxide layer 24 into the nitride trapping layer 20.

Figure 7:
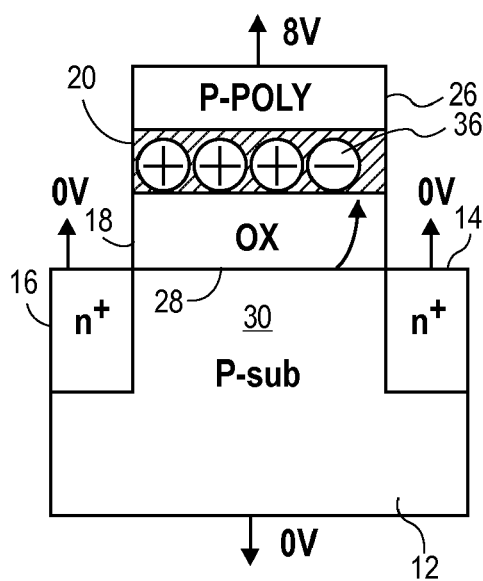
FIG. 7 is a partial sectional side elevation view of an example embodiment of a conventional non-volatile memory (NVM) cell undergoing channel hot electron (CHE) programming of the right bit (Bit-R) of the cell.

FIG. 7 is a partial sectional side elevation view of an example embodiment of a conventional non-volatile memory (NVM) cell 10 undergoing channel hot electron (CHE) programming of the right bit 36 (Bit-R) of the cell. In one embodiment, by programming the right bit 36 (Bit-R), the Vt of the right bit 36 increases from the TOM (Turn-On-Mode) erased Vt (e.g., Vt<Vti) to a programmed Vt, wherein the programmed Vt is greater than the TOM erased Vt. As discussed above with reference FIG. 4, the programmed Vt is higher but the value is much less than if the cell had not first been erased to a low Vt (Vt<Vti), as discussed with reference to FIGS. 3, 5, and 6. In other words, without the TOM erase operation, the higher the Vt of the programmed target bit (e.g., Bit-R), the larger the second bit effect would be on the Vt of the non-target bit (e.g., Bit-L).

Figure 8:
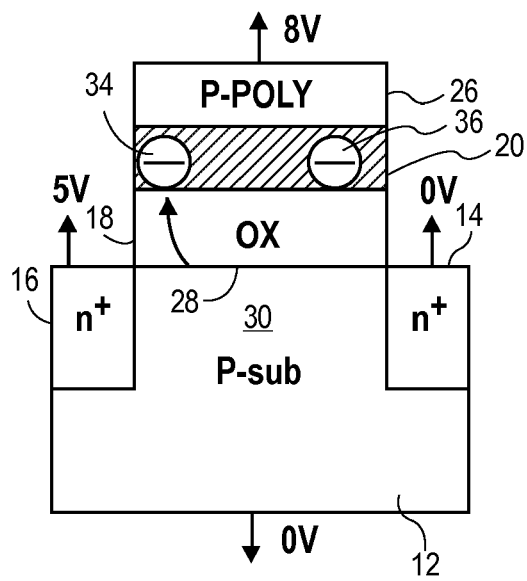
FIG. 8 is a partial sectional side elevation view of an example embodiment of a non-volatile memory cell undergoing channel hot electron (CHE) programming of the left bit (Bit-L)

FIG. 8 is a partial sectional side elevation view of an example embodiment of a non-volatile memory cell (e.g., NVM cell 10) undergoing channel hot electron (CHE) programming of the left bit 34 (Bit-L). In one embodiment, similar to the programming of the right bit 36, by programming the left bit 34, the left bit 34 Vt increases from the TOM erased Vt to a programmed Vt, wherein the programmed Vt is greater than the TOM erased Vt. However, the second bit effect has been reduced because the NVM cell had first been erased using the TOM erase operation, bringing Vt <Vti as discussed with reference to FIGS. 3, 5, and 6.

Figure 9:
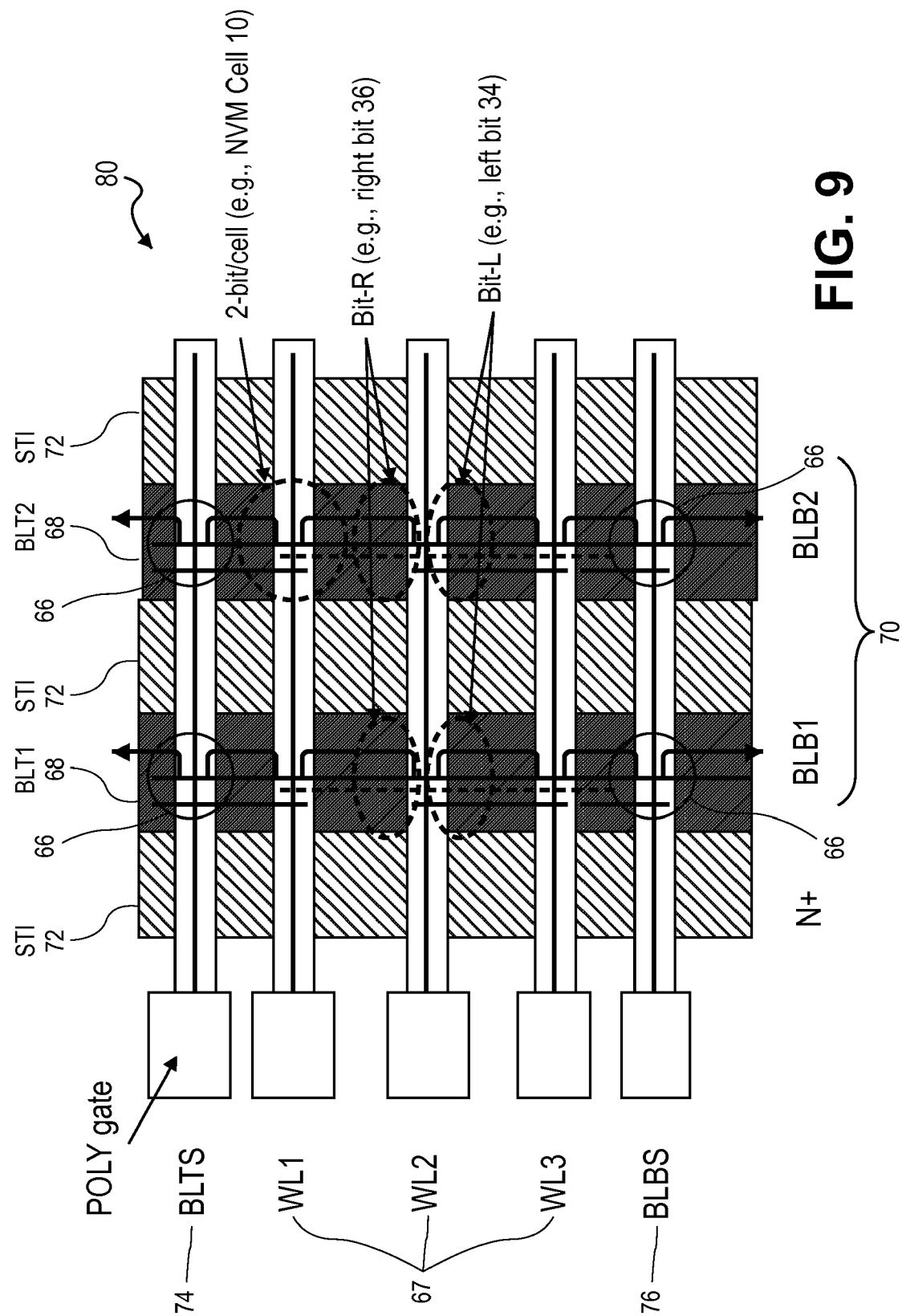
FIG. 9 illustrates an example embodiment of a NAND array comprised of a multitude of two-bit NVM cells similar to the NVM cell with reference to FIGS. 1, 5, and 6.

FIG. 9 illustrates an example embodiment of a NAND array 80 comprised of a multitude of two-bit NVM cells 65 similar to the NVM cell 10 with reference to FIGS. 1, 5, and 6. Specifically similar to NVM cell 10 but not shown due to the particular view of FIG. 9, the cells of the NAND array 80 include a substrate 12, a first source/drain layer 14, a second source/drain layer 16, an oxide layer 18, a nitride charge trapping layer 20, a gate layer 26, a substrate surface 28, and a well region 30 within the substrate 12. The multitude of memory cells are disposed on the surface of the substrate 12 above the well region 30 and between the first source drain region 14 and the second source drain region 16. In various embodiments, the cells may have an oxide layer configuration as described in any one or more of FIGS. 1, 5, and 6. Also illustrated is an example of a left bit and a right bit similar to the left bit 34 and the right bit 36 of NVM cell 10 described above.

In addition to the elements similar to NVM cell 10, FIG. 9 includes bit line control cells 66 and a plurality of word lines 67 (WL1-WL3) disposed, with reference to FIGS. 1, 5, and 6, above the charge trapping layer 20 relative to the substrate surface 28.

Also included are a plurality of top bit lines 68 (BLT1 -BLT2, Bit Line Top) and bottom bit lines 70 (BLB1-BLB2, Bit Line Bottom) disposed between insulation lines 72 (STI). Again, referring to FIGS. 1, 5, and 6, the oxide layer 18 is disposed in a portion of the substrate surface 28 proximate the well region 30. In this example, the top bit lines 68 and the bottom bit lines 70 (BLT1-BLT2 and BLB1-BLB2) and insulation lines 72 (STI) are disposed perpendicular to the word lines 67 (WL1-WL3). The top bit lines 68 and the bottom bit lines 70 are electrically coupled with the first and second source drain regions 14, 16 of the multitude of memory cells of the NAND array 80.

The charge trapping layer 20 may be formed of a silicon nitride material. Further, the memory cell 10 may comprise a second oxide layer 22 or 24 disposed on the opposite side of the charge trapping layer 20 as that of the first oxide layer 18 relative to the substrate surface 28 of the semiconductor substrate 12. The plurality of word lines 67 are disposed above the second oxide layer 22 or 24 relative to the substrate surface 28 of the semiconductor substrate 12. The word lines 67 may be formed from doped poly silicon or metal.

In various embodiments, the bit line control cells 66 control the electrical coupling of each of the top bit lines 68 and the bottom bit lines 70 with the first and second source drain regions (e.g., drain/source regions 14, 16) of the plurality of memory cells. The bit line control cells 66 may be disposed beneath a BLTS 74 (Bit Line Top Select) line and a BLBS 76 (Bit Line Bottom Select) line. The bit line control cells 66 may be activated by the application of a bias voltage (control activation voltage) to BLTS 74 and BLBS 76. In one embodiment, the voltage applied to BLTS 74 and BLBS 76 to activate the bit line control cells 66 is approximately 10 volts direct current. Positive voltage may be transmitted via the top bit lines 68 and the bottom bit lines 70 when the bit line control cells 66 are activated.

FIG. 10 illustrates a method of operations pertaining to erasing a multitude of NVM cells (e.g., NVM cell 10) in the NAND array 80. The erasure operation is the first operation in the TOM (Turn-On-Mode) described above. In various embodiments, the TOM operations include erasing the memory cells using hole injection erasure, programming the left and right bits of each memory cell, and reading the program state of the bits of each cell. FIG. 10 specifically illustrates the voltages applied to the various lines in the erasure operation. For example, the top bit lines 68 and the bottom bit lines 70 are held at 0V, the word lines 67 at 16V, and the BLTS 74 line and a BLBS 76 line at 10V. As discussed above with reference to FIG. 3 and corresponding structure described in FIG. 9, holes 31 may be induced to flow from the gate layer 26 into the nitride layer 20 by application of a gate voltage bias of approximately 14-20 volts direct current (DC) via word lines 67, and a reference voltage (e.g., 0 volts) to the substrate 12 and to the first and second source/drain regions via the top bit lines 68 and the bottom bit lines 70. As discussed above, hole injection erasure when applied to the NVM cell 10 within this gate voltage range (in this example, 16V) lowers the initial Vt of the cell to a level that may reduce second-bit effect during subsequent programming. In various embodiments the reduced level of the Vt may be near zero or negative. The lower the initial voltage (Vti) results in a reduced second-bit effect and thus a larger operational window for each bit of the cell.

FIGS. 11A and 11B illustrate various exemplary advantages of the hole injection erase operation at the memory cell level. In FIG. 11A, the NVM cell 10, before the hole injection erase, is in an "off" state while the cell gate 26 is biased with a relatively low (e.g., reference) voltage. FIG. 11B shows the NVM cell 10 of FIG. 11A after the NVM cell 10 has undergone hole injection erase. The NVM cell 10 after hole injection erase has an induced channel 32 with the same relatively low or reference voltage applied to the gate 26. This induced channel 32 results in the two-bit cell 10 being in the "on" state with no additional bias voltage on the gate 26. After the hole injection erasure, the Vt of the NVM cell 10 is lower than the Vti of the NVM cell 10 prior to erasure. This may impart the advantage described in relation to FIGS. 3, 4A and 4B in that the second bit effect may be lessened and thereby widen the window of operation.

Referring to the NAND array 80 of FIG. 10, the activation voltage (e.g., to BLTS 74) applied during the erase procedure of the memory cells (e.g., memory cell 10) is typically between approximately 8-12 volts direct current. In this example, the activation voltage is approximately 10 volts direct current. In various embodiments, the voltage applied to word lines WL1-WL3 during the erase operation may be between approximately 14-20 volts direct current. In this example, the erasing voltage is approximately 16 volts direct current.

FIG. 12 illustrates the second operation of the TOM for programming a nonvolatile memory cell (e.g., NVM cell 10) in the NAND array 80. In FIG. 12, the NAND array 80 is structured identically to that as described in the erasing operations described with reference to FIG. 11. FIG. 12 demonstrates the programming of one bit (e.g., right bit 36) of one memory cell in the NAND array 80 to a zero state or, in this embodiment, a programmed state. This may be accomplished by applying; a control activation voltage to the bit line control cells 66 via the BLTS 74 and BLBS 76 lines, a cell bit program voltage to the bit line BLT1 of the top bit lines 68 which is associated with the selected first or second source drain regions 14, 16 of the NVM cell to be programmed, a reference voltage to the BLBS and the substrate 12 and a programming voltage to the word line WL2 of the word lines 67 associated with the NVM cell to be programmed. Additionally, a word line activation voltage may be applied to the word lines WL1 and WL3 of the word lines 67 not associated with the NVM cell to be programmed.

In various embodiments, the cell bit program voltage must be sufficient to cause electron tunneling from the unselected first or second source drain region 14, 16 through the well region 30 toward the charged trapping layer 20 to program a bit associated with the selected first or second source drain region 14, 16. Also a reference voltage is applied to the bit line BLB1 (of the top bit lines 68) associated with the non-selected first or second source drain region 14, 16 of the NVM cell to be programmed. A reference voltage is also applied to all remaining bit lines BLT2 and BLB2. As FIG. 12 also shows, this particular application of programming voltages, word line activation voltages, and cell bit program voltages in addition to programming the selected bit of the selected NVM cell also has the effect of writing a logic "1" state to the other bits of the other NVM cells associated with the word line WL2 onto which programming voltage is applied.

The control activation voltage for the bit line control cells 66 for the programming operations is typically between approximately 4-11 volts direct current. In this example, the activation voltage is approximately 10 volts direct current. The programming voltage of the word line WL2 associated with the NVM cell (e.g., NVM cell 10) to be programmed is typically between approximately 6-10 volts direct current. In this example, the programming voltage is approximately 8 volts direct current. The word line activation voltage for the programming operation is greater than the programmed threshold voltage of the cells 10 associated with the word line that is to be activated. The word line activation voltage typically is in the range of approximately 3-8 volts direct current. The cell bit program voltage is typically in the range of approximately 3-7 volts direct current and in this example, approximately 5 volts direct current.

Figure 13:
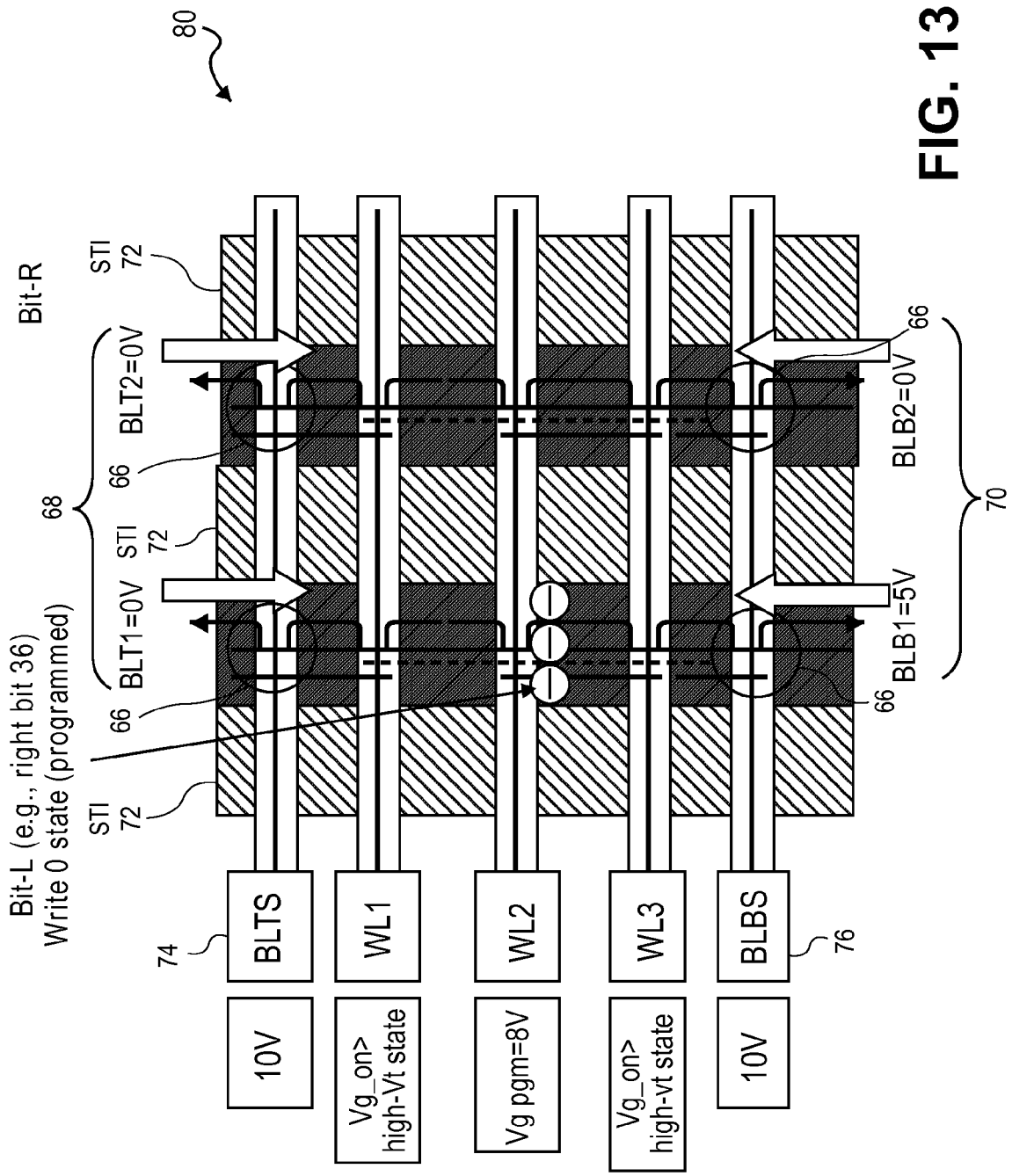
FIG. 13 illustrates a method of operations pertaining to the programming described in relation to FIG. 12 and adapted to program the bit of the NVM cell that was left un-programmed.

FIG. 13 illustrates a method of operations pertaining to the programming described in relation to FIG. 12 and adapted to program the bit of the NVM cell (e.g., left bit 34) that was left un-programmed (or programmed in the logic "1" state). As illustrated in FIG. 13, the formerly un-programmed bit of the target NVM cell is programmed by changing the associated bit line BLB1 (of the bottom bit lines 70) voltage of the now selected first or second source/drain region 14, 16 associated with the bit to be programmed (e.g., left bit 34) from a reference voltage to a cell bit program voltage. The voltage applied to the bit line BLT1 associated with the now un-selected first or second source/drain regions 14, 16 of the bit that was programmed in FIG. 12 is changed from a cell bit program voltage to a reference voltage. The remainder of the programming operation is the same as illustrated and described with reference to FIG. 12.

Figure 14:
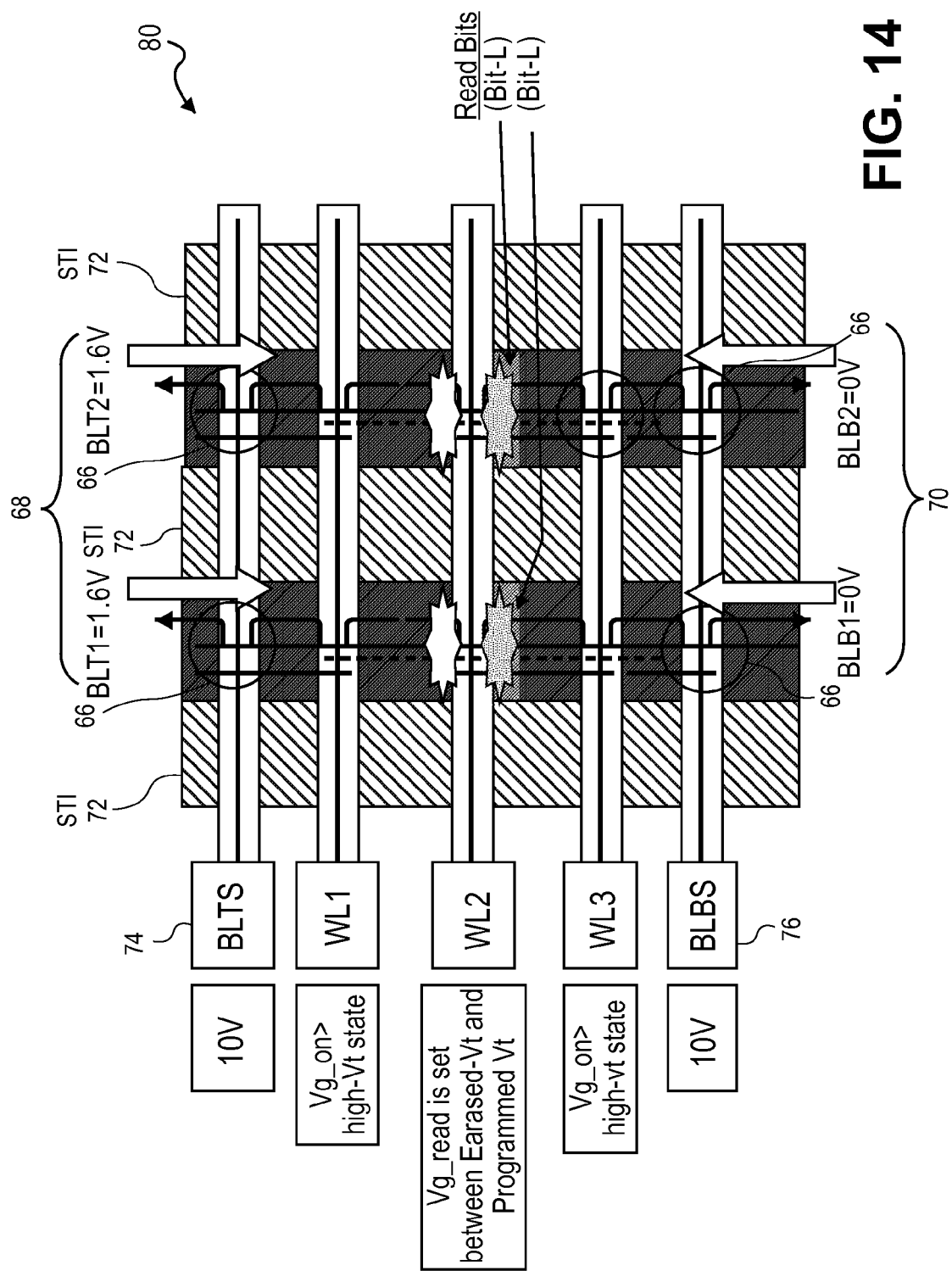
FIG. 14 illustrates a method of operations pertaining to reading the left bits of two memory cells.

FIG. 14 illustrates a method of operations pertaining to reading the left bits (Bit-L, e.g., left bit 34) of two memory cells (e.g., two NVM cell 10) in the NAND array 80, which is the last operation of the TOM. Both memory cells and the NAND array 80 are structured as described in association with the erasing and programming operations described above. Each left bit is read by applying a control activation voltage to the bit line control cells 66 and applying a reference voltage to the substrate 12 of the memory cells to be read. Further a read voltage is applied to the word line WL2 associated with the memory cells to be read and a word line activation voltage is applied to the word lines WL1 and WL3 associated with the memory cells not being read. Additionally, a cell bit read voltage is applied to the top bit lines 68 (BLT1-BLT2) and a reference voltage applied to the bottom bit lines 70 (BLB1 -BLB2).

The control activation voltage of the bit line control cells 66 for the reading operation may be between approximately 4-11 volts direct current and applied via the top bit lines 68 and the bottom bit lines 70. In this example, the control activation voltage of the bit line control cells are approximately 10 volts direct current. The read voltage applied to the word line WL2 in order to read the memory cells 10 associated with that word line WL2 may be between the erased threshold voltage level and the programmed voltage threshold of the memory cells 10 associated with word line WL2. The word line read voltage may be between approximately 0-5 volts direct current. The word line activation voltage applied to the word lines WL1 and WL3 not associated with memory cells to be read is greater than the high voltage threshold (Vt) state of the memory cells associated with the word line that is to be activated. This voltage may be between approximately 3-8 volts direct current. The cell bit read voltage of the reading method described above may be between approximately 1-3 volts direct current. In this example the cell bit read voltage is approximately 1.6 volts direct current and is applied to the top bit lines 68.

Figure 15:
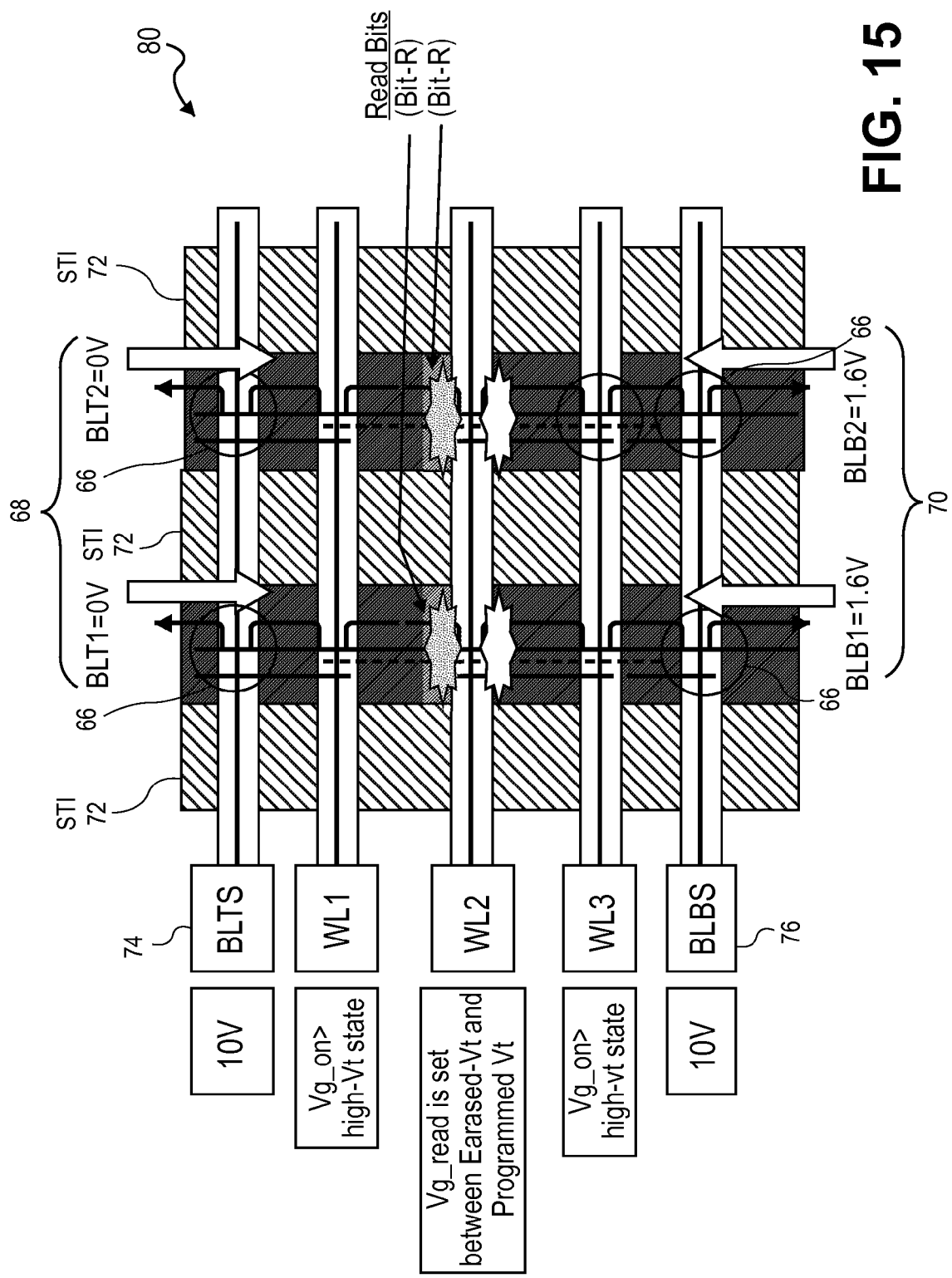
FIG. 15 illustrates a reading operation described in association with FIG. 14 and applied in a manner to read the right bits of two memory cells of the NAND array.

FIG. 15 illustrates a reading operation described in association with FIG. 14 and applied in a manner to read the right bits (Bit-R, e.g., right bit 36) of two memory cells of the NAND array 80. Similar to the procedure to read the left bits discussed with reference to FIG. 14, to read the right bits of the selected memory cells associated with the selected word line WL2, the cell bit read voltage is applied to the bottom bit lines 70 and a reference voltage is applied to the top bit lines 68. The rest of the reading operation is the same as described with reference to FIG. 14.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What it claimed is:

1. A method of operating a memory device, the method comprising:
erasing a plurality of two-bit memory cells, each two-bit memory cell comprising a first bit and a second bit, by:

applying a reference voltage to a first bit line and a second bit line, the first bit line associated with the first bits of each two-bit memory cell and the second bit line associated with the second bits of each two-bit memory cell;

applying a control activation voltage to a first bit line select and a second bit line select, the first bit line select associated with the first bits of each memory cell and the second bit line select associated with the second bits of each memory cell; and applying an erase voltage to a plurality of word lines associated with each two-bit memory cell, wherein the erase voltage is between 14 and 20 volts, wherein applying the erase voltage includes creating a threshold voltage associated with each two-bit memory cell less than or equal to 0 volts.

2. The method of claim 1, wherein the control activation voltage is between 8 and 12 volts.

* * * * *